(12) United States Patent
Wang et al.

(10) Patent No.: US 6,323,516 B1
(45) Date of Patent: Nov. 27, 2001

(54) FLASH MEMORY DEVICE AND FABRICATION METHOD HAVING A HIGH COUPLING RATIO

(75) Inventors: Larry Y. Wang, San Jose, CA (US); Steven K. Park, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/390,052

(22) Filed: Sep. 3, 1999

(51) Int. Cl.$^7$ .................................................. H01L 29/788
(52) U.S. Cl. .............................................. 257/317; 438/257
(58) Field of Search ..................................... 257/315, 317, 257/321; 438/257

(56) References Cited

U.S. PATENT DOCUMENTS

| | | | | |
|---|---|---|---|---|
| 4,590,504 | * | 5/1986 | Guterman ............................. | 257/316 |
| 5,159,431 | * | 10/1992 | Yoshikawa ........................... | 257/320 |
| 5,637,896 | * | 6/1997 | Huang .................................. | 257/316 |
| 5,643,813 | * | 7/1997 | Acocella et al. ..................... | 438/593 |
| 6,130,129 | * | 10/2000 | Chen .................................... | 438/257 |
| 6,153,494 | * | 11/2000 | Hsieh et al. ......................... | 438/424 |
| 6,171,907 | * | 1/2001 | Tuntasood ............................ | 438/264 |
| 6,184,085 | * | 2/2001 | Jeong .................................... | 438/258 |
| 6,214,667 | * | 4/2001 | Ding et al. ........................... | 438/257 |
| 6,228,713 | * | 5/2001 | Pradeep et al. ...................... | 438/257 |

OTHER PUBLICATIONS

S. Aritome et al., A 0.67 um2 Self–Aligned Shallow Trench Isolation Cell (SA–STI–Cell) For 3V–only 256Mbit NAND EEPROMS, IEDM, pp. 61–64, 1994.*

Y.S. Hisamune, A High Capacitive–Coupling Ratio (HiCR) Cell for 3 V–Only 64 Mbit and Future Flash Memories, IEDM, pp. 19–22, 1993.*

* cited by examiner

*Primary Examiner*—Eddie Lee
*Assistant Examiner*—George C. Eckert, III
(74) *Attorney, Agent, or Firm*—Foley & Lardner

(57) ABSTRACT

Embodiments of the invention comprise a new device and technique to realize an improved coupling ratio integrated circuit device. This improvement is achieved by increasing an overlap portion between the first and second polysilicon layers, so as to increase the effective coupling ratio between the layers. In the embodiments of the present invention, a relatively tall or large portion of oxide is formed over at least a portion of each of a plurality of shallow trench isolation regions. This oxide is then utilized to provide a larger first polysilicon layer surface area, but without substantially increasing the tunnel oxide layer surface area. Then, a dielectric interlayer is formed upon the surface of the first polysilicon layer, and next, a second polysilicon layer is formed upon the dielectric interlayer. This increased overlap portion thus allows for an increased coupling ratio. Further, the coupling ratio may be tailored by adjusting either or both of the first and second polysilicon layer surface areas without requiring a substantial change in the tunnel oxide layer surface area.

9 Claims, 6 Drawing Sheets

FLASH MEMORY DEVICE AND FABRICATION METHOD HAVING A HIGH COUPLING RATIO

BACKGROUND OF THE INVENTION

The present invention relates generally to an integrated circuit ("IC"). More specifically, this invention relates to the fabrication of an integrated circuit having an improved coupling capacitance.

DESCRIPTION OF THE PRIOR ART

The present invention applies particularly to the fabrication of non-volatile memory integrated circuits. Some examples of non-volatile memory integrated circuits include an EPROM, an EEPROM, a flash memory device, and a complementary metal oxide silicon ("CMOS") type device, such as a field-effect transistor ("FET") containing a metal gate over thermal oxide over silicon ("MOSFET") and other ultra-large-scale integrated-circuit ("ULSI") systems.

Non-volatile memory integrated circuits are utilized in a wide variety of commercial and military electronic devices, including, e.g., hand held telephones, radios and digital cameras. The market for these electronic devices continues to demand devices with a lower voltage, a lower power consumption and a decreased chip size. Also, the demand for greater functionality is driving the "design rule" lower, for example, from a 0.35–0.25 micron technology to a 0.18 micron, or a 0.15 micron technology, or even lower.

A portion of a conventional flash memory cell that comprises a flash memory IC is illustrated in FIG. 1. In referring to FIG. 1, a portion of a conventional flash memory cell fabrication process is described.

FIG. 1 illustrates a cross-sectional view of the single flash memory cell 10 that is comprised of a conventional substrate 20. However, the respective source and drain regions are not shown. A tunnel oxide ("$T_{ox}$") layer 30 is formed over the upper substrate portion 22, over which is formed a first polysilicon layer 40. Polysilicon layer 40 may be patterned, for example, by masking and etching. Next, an interpoly dielectric layer 50, e.g., Oxide Nitride Oxide ("ONO"), is formed over the first polysilicon layer 40. Then, a second polysilicon layer 60 is formed upon the interpoly dielectric layer 50. The conventional silicide layer is omitted for clarity.

The memory device illustrated in FIG. 1 utilizes the first polysilicon layer 40 as a floating gate in order to store a data element. The floating gate is controlled by the second polysilicon layer 60 that functions as a control gate.

Conventional voltages of the stored data element may be on the order of 3.3 volts. However, the voltage that is applied to the control gate, or second polysilicon layer 60, that controls access to this data element may be on the order of 9 volts. Thus, a conventional charge pump, not shown, may be located on the flash memory IC in order to raise the chip voltage from 3.3 volts to a target voltage of approximately 9 volts.

Charge pumps are relatively large, taking up substantial space on the memory cell and further compromising the reliability of the IC. As design rules continue to decrease, the size of the charge pump becomes an obstacle in chip design. However, the size of the charge pump may be decreased by decreasing the target voltage. The target voltage may be decreased by increasing the gate coupling ratio ("α") of the memory cell.

The gate coupling ratio ("α") may be defined as:

$$\alpha = C_{ono}/(C_{ono} + C_{tox})$$

where $C_{ono}$ is the capacitance between the first polysilicon layer 40 and the second polysilicon layer 60, and $C_{tox}$ represents the capacitance between the substrate upper portion 22 and the first polysilicon layer 40.

Accordingly, what is needed is an IC device and a method of fabricating an IC device that allows for an improvement in the gate coupling ratio performance. By increasing the gate coupling ratio performance, the target voltage of the charge pump may be decreased. Thus, the power consumption of the IC may thereby be decreased. This, in turn, may allow for decreasing the size of the charge pump and improving the reliability of the IC device.

Further, by reducing the charge pump size, the device density may be improved, i.e. increased.

One solution is to increase the width of the first polysilicon layer 40 so as to increase the capacitance. However, this also undesirably limits the ability to reduce the cell 10 size and thus impedes device density improvements.

What is needed is a device and method for improving the capacitance between the first polysilicon layer 40 and the second polysilicon layer 60, while keeping the first polysilicon layer 40 and tunnel oxide layer 30 contact area relatively low.

SUMMARY OF THE INVENTION

Embodiments of the present invention are best understood by examining the detailed description and the appended claims with reference to the drawings. However, a brief summary of embodiments of the present invention follows.

Briefly described, an embodiment of the present invention comprises a device and a method that provides for the improvement of the coupling ratio performance of an integrated circuit device.

This improvement is achieved by increasing an overlap portion between the first and second polysilicon layers, so as to increase the effective coupling ratio between the layers. In an embodiment of the present invention, a relatively tall or large portion of oxide is formed over at least a portion of each of a plurality of shallow trench isolation regions. This oxide is then utilized to provide a larger first polysilicon layer surface area, but without substantially increasing the tunnel oxide layer surface area. Then, a dielectric interlayer is formed upon the surface of the first polysilicon layer, and next, a second polysilicon layer is formed upon the dielectric interlayer. This increased overlap portion thus allows for an increased coupling ratio. Further, the coupling ratio may be tailored by adjusting either or both of the first and second polysilicon layer surface areas without requiring a substantial change in the tunnel oxide layer surface area.

An embodiment of the present invention provides a device and method for improving the coupling ratio. The coupling ratio may be tailored by adjusting either or both the first and second polysilicon area sizes independently of the tunnel oxide area.

This invention may be implemented for a shallow trench isolation structure ("STI") type device, as well as other devices.

Other arrangements and modifications will be understood by examining the detailed description and the appended claims with reference to the drawings.

BRIEF DESCRIPTION OF THE DRAWINGS

Embodiments of the present invention are described in detail herein with reference to the drawings in which.

The accompanying drawings, wherein like numerals denote like elements, are incorporated into and constitute a part of the specification, and illustrate presently preferred exemplary embodiments of the invention. However, it is understood that the drawings are for purpose of illustration only, and are not intended as a definition of the limits of the invention. Thus, the drawings, together with the general description given above, and the detailed description of the preferred embodiments given below, together with the appended claims, serve to explain the principles of the invention.

DETAILED DESCRIPTION OF THE PREFERRED EMBODIMENT

An embodiment of the present invention is illustrated utilizing a flash memory device. FIGS. 2–6 illustrate various techniques in the practice of the embodiments of the present invention. It will be understood by one skilled in the art that various components of the present invention as illustrated in FIGS. 2–6 are not shown in order to simplify the illustrations.

Figure 1:
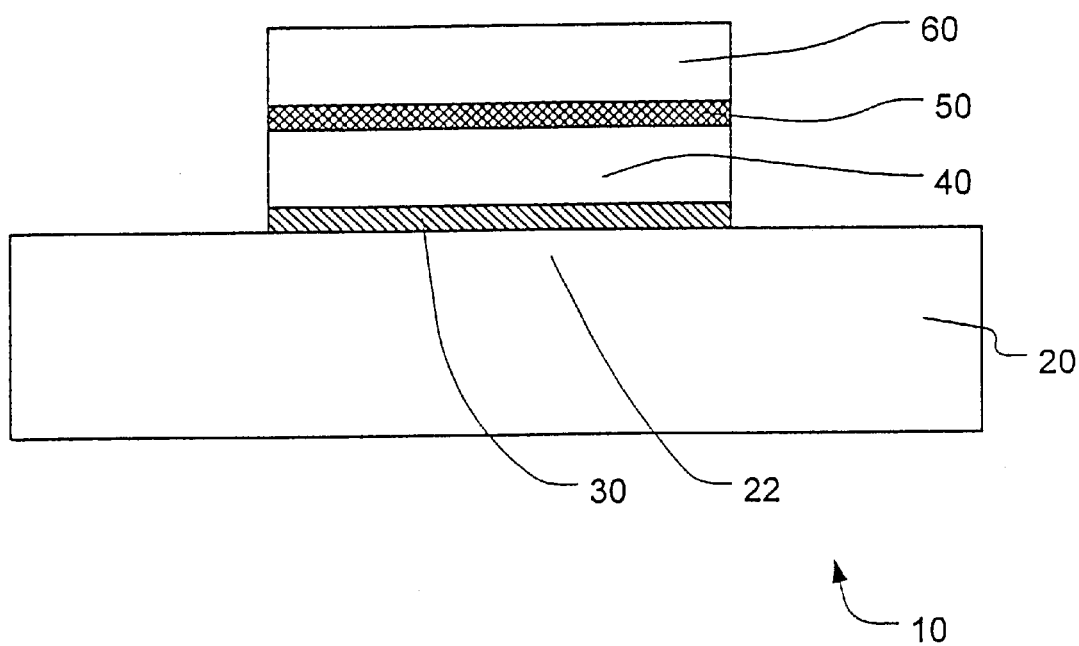
FIG. 1 illustrates a cross-sectional representation of a portion of a conventional polysilicon gate structure of a flash memory device.
Figure 2:
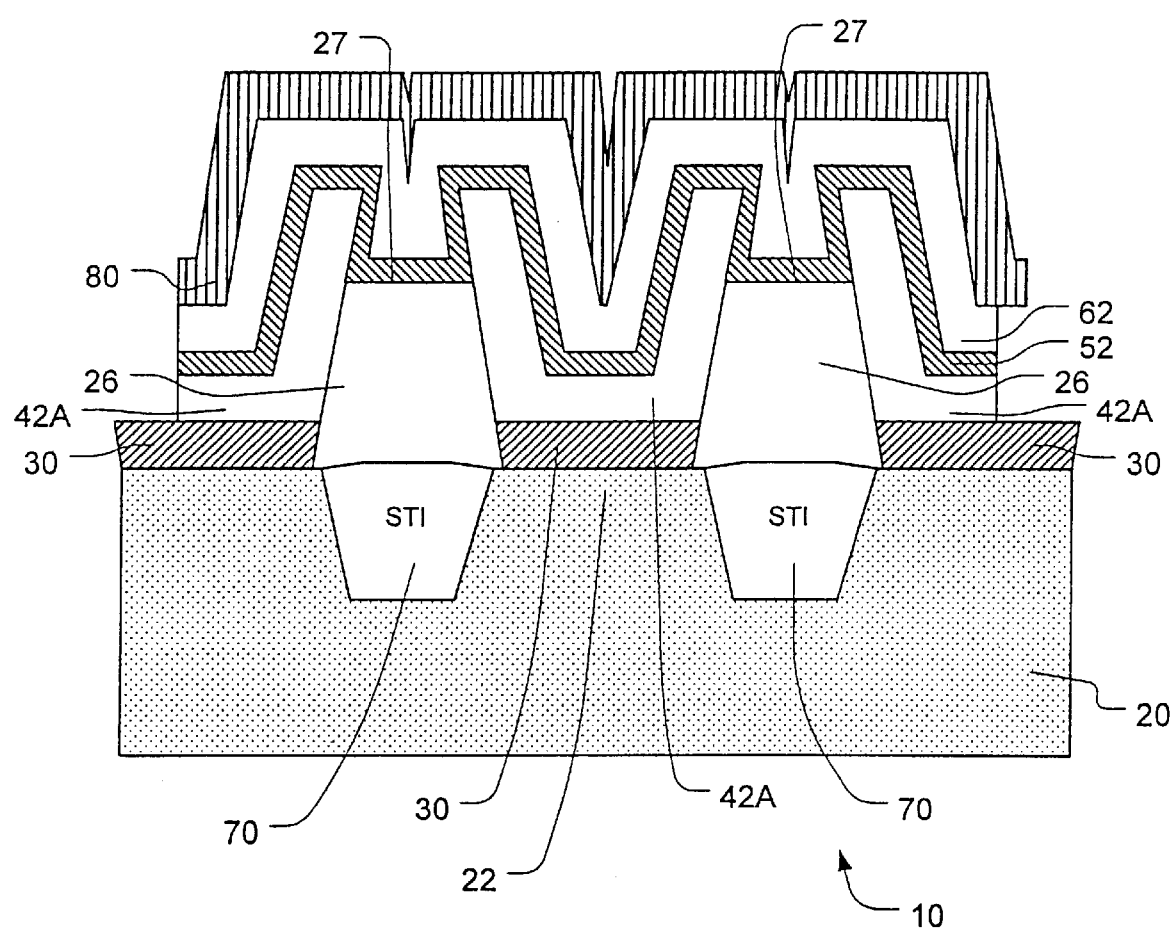
FIG. 2 illustrates a cross-sectional representation of a portion of a polysilicon gate structure of a flash memory device in accordance with the principles of an embodiment of the present invention.

FIG. 2 illustrates a memory device 10 that is comprised of a substrate 20. The substrate 20 includes an upper portion 22 that is generally located approximately between a source and drain region that are not shown. A shallow trench isolation ("STI") region 70 is located in the substrate 20, and each STI region 70 is covered by an oxide portion 26. Between the oxide portions 26 are a tunnel oxide ("$T_{ox}$") layer 30, and a first conductive, e.g., polysilicon, layer 42A. Stacked upon the first polysilicon layer 42A and the oxide portions 26 are an interlayer dielectric layer 52, a second conductive, e.g., polysilicon, layer 62, and a silicide layer 80.

In alternate embodiments of the present invention, the term "substrate" may include a silicon-based substrate 20 as shown in FIGS. 2–6 or, e.g., a doped silicon, a gallium arsenide (GaAs), a gallium arsenide phosphide (GaAsP), a germanium, or a silicon germanium (SiGe) substrate. The "substrate" may also include any underlying material or materials that may be utilized, or upon which a device, a circuit, or an epitaxial layer may be formed. In other alternative embodiments, this "substrate" may include, for example, an $SiO_2$ or an $Si_3N_4$ layer in addition to the semiconductor substrate portion 20. In this regard, the term "substrate" is being utilized to generally define the elements for layers that underlie a layer or portions of interest. Also, the "substrate" may be a superconductor base or any other base on which a layer is formed, for example, a metal layer.

In the illustrated embodiment, an STI arrangement is utilized. The substrate may include an STI between each memory cell device. Devices that may comprise an STI type device include, for example, a metal oxide semiconductor field effect transistor ("MOSFET"), a memory cell, and other devices.

STI structures do not have a "bird's beak" profile that is common in a Local Oxidation of Silicon ("LOCOS") formation of a field oxide region. However, in an alternate embodiment, a LOCOS Isolation process may be utilized.

An embodiment of the present invention provides a device and method for improving the capacitance between the first polysilicon layer 40 and the second polysilicon layer 60, while keeping the first polysilicon layer 40 and tunnel oxide layer 30 contact area relatively low. Also, as is clear from the detailed description herein together with the drawings, embodiments of the present invention may be practiced by utilizing current CMOS processes.

The method of forming the structure shown in FIG. 2 will now be described with reference to FIGS. 2–6.

Figure 3:
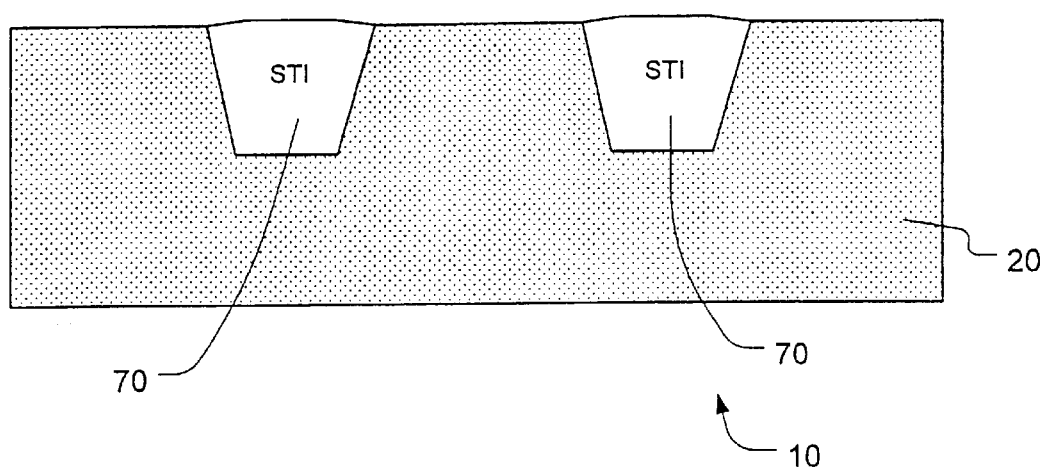
FIG. 3 is a cross-section of the polysilicon gate structure of FIG. 2 illustrating a shallow trench isolation formation in accordance with the principles of an embodiment of the present invention.

First, as shown in FIG. 3, STI regions 70 are formed in substrate 20.

Figure 4:
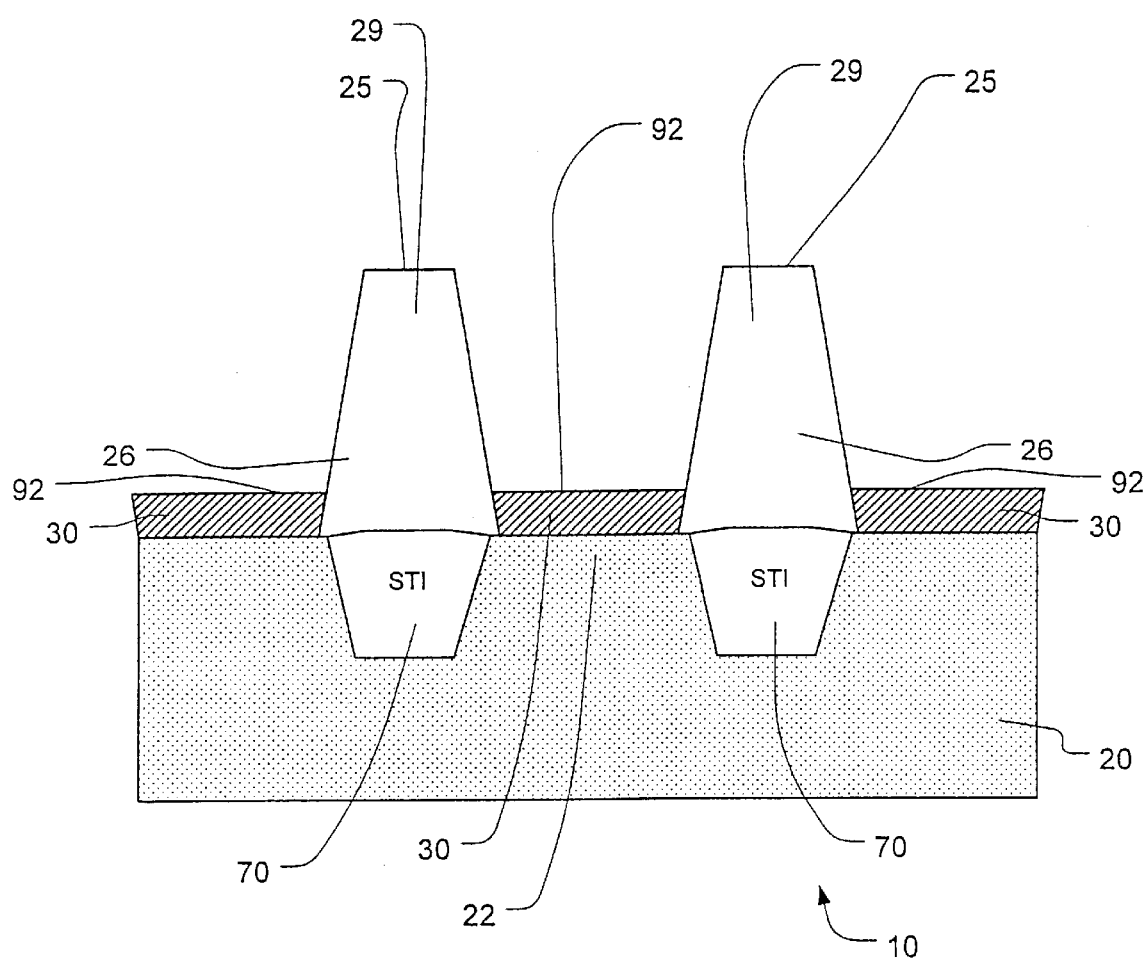
FIG. 4 is a cross-section of the polysilicon gate structure of FIG. 2 illustrating an oxide and tunnel oxide layer formation in accordance with the principles of an embodiment of the present invention.

Next, as shown in FIG. 4, an oxide portion 26 is formed over each STI region 70. Each oxide portion 26 preferably forms a relatively high cap-like structure that includes an upper oxide portion 29. The cap-like structure is relatively tall, as compared with the height of the adjacent areas. The oxide portion 26, and the open cell transistor area 92 may be formed by utilizing a Chemical Vapor Deposition ("CVD") technique, and then masking and etching. The masking and etching is utilized to reopen the cell transistor area 92.

Also, as illustrated in FIG. 4, a tunnel oxide ("$T_{ox}$") layer 30 is formed over the substrate, including the substrate upper portion 22. The tunnel oxide layer 30 is formed so that the oxide portions 26 form spacers between the tunnel oxide layer 30 portion of each memory cell region. The tunnel oxide layer 30 may be formed by utilizing a tunnel oxide pre-clean and a tunnel oxidation technique.

Figure 5:
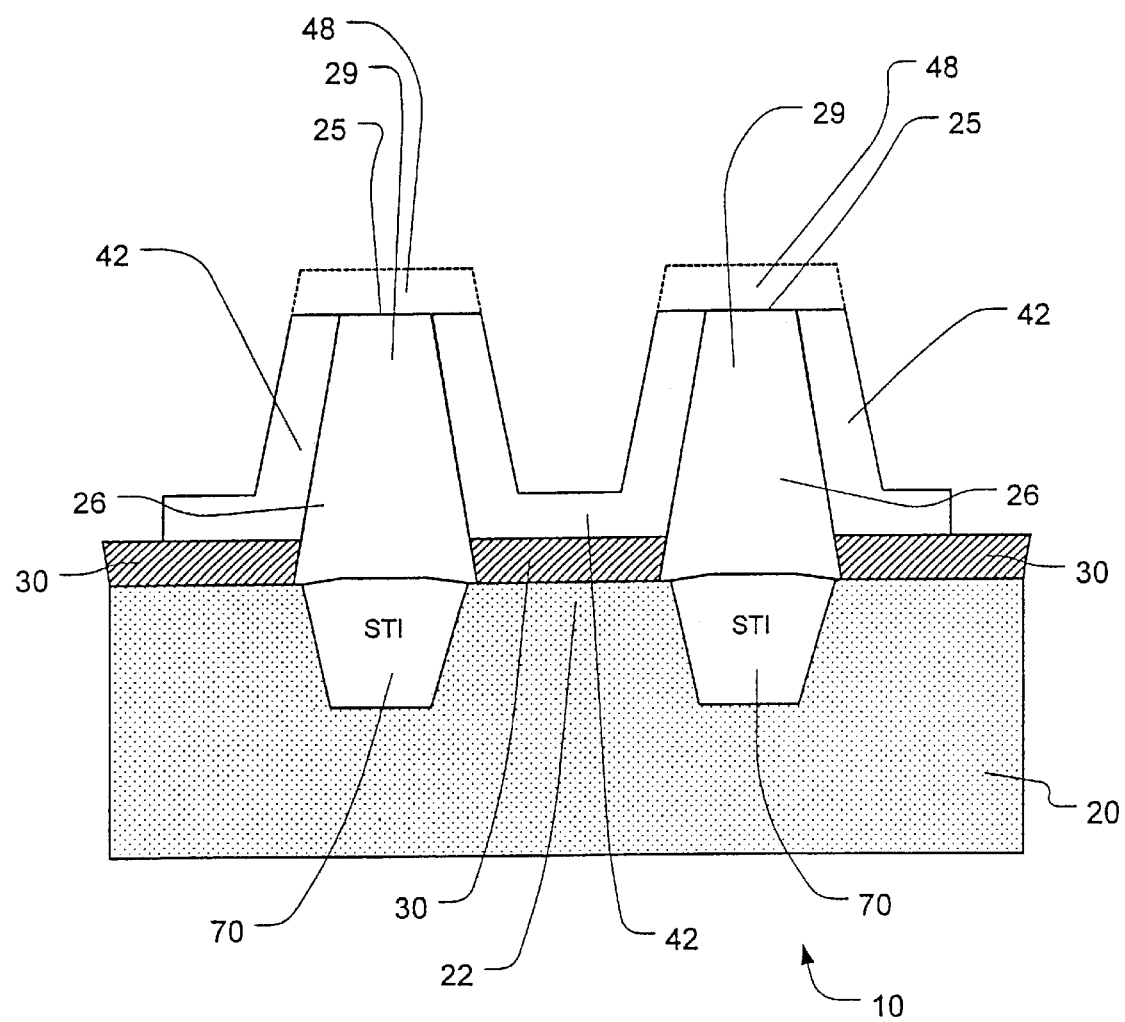
FIG. 5 is a cross-section of the polysilicon gate structure of FIG. 2 illustrating a first polysilicon layer formation in accordance with the principles of an embodiment of the present invention.

Next, as shown in FIG. 5, a first polysilicon layer, including main portions 42 and top portions 48, is formed upon the tunnel oxide layer 30, adjacent the oxide portions 26, and on top of oxide portion top surfaces 25. After the first polysilicon layer 42, 48 is deposited, a CMP technique may be utilized to remove the first polysilicon top portions 48 so as to re-expose the oxide portion top surfaces 25. Thus, the remaining first polysilicon layer main portions 42 each preferably form a channel-like structure for each memory cell. Upon removal of the first polysilicon layer top portions 48, the first polysilicon layer main portions 42 comprise the first polysilicon layer 42A as shown in FIGS. 2 and 6.

Figure 6:
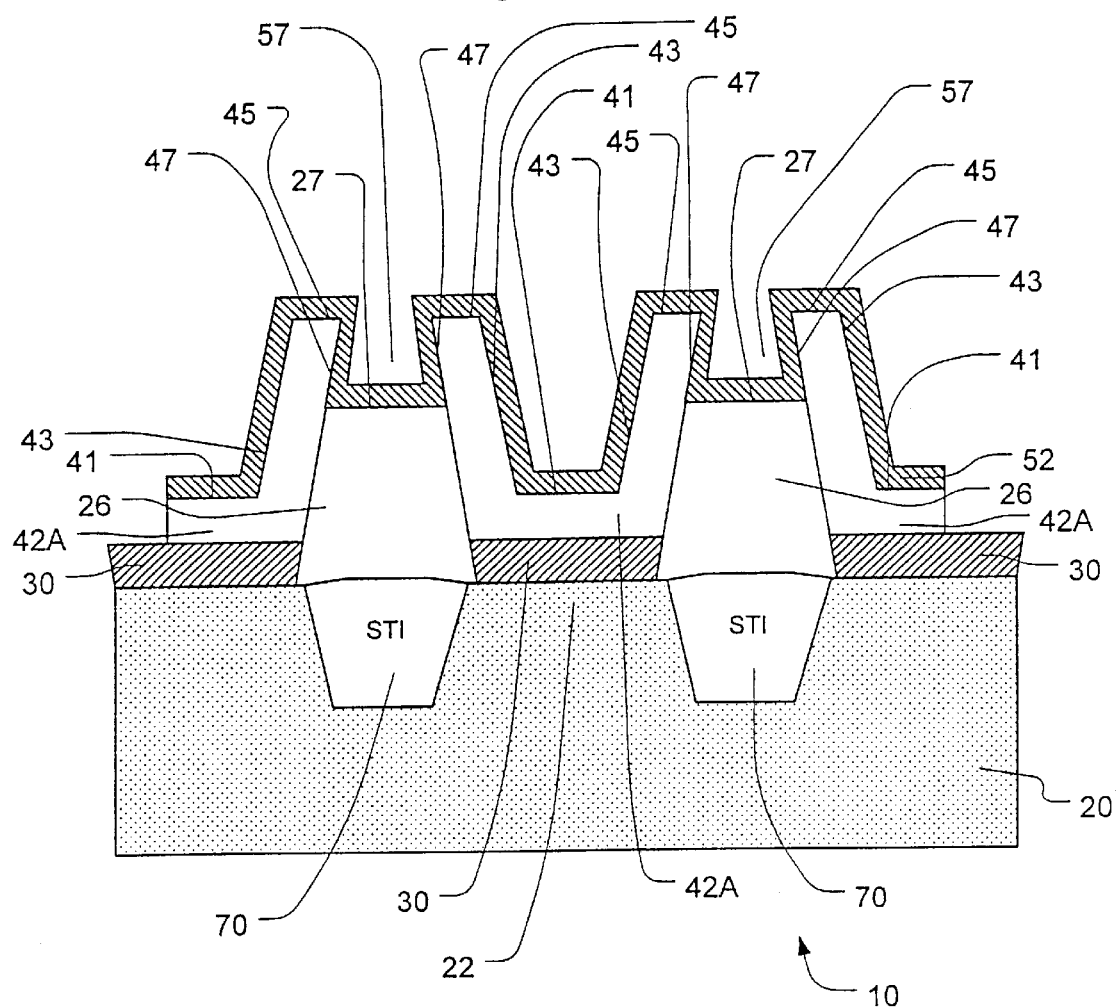
FIG. 6 is a cross-section of the polysilicon gate structure of FIG. 2 illustrating a dielectric interlayer formation in accordance with the principles of an embodiment of the present invention.

Next, as illustrated in FIG. 6, the upper oxide portions 29 are removed so as to expose a new oxide portion top surface 27. The upper oxide portions 29 may be removed, for example, by utilizing either a wet or dry etch technique.

This removal of the upper oxide portions 29 allows for the definition of an undercut area 57 adjacent to the top surface 27 and backside surfaces 47. This undercut area 57 may be utilized to provide an adjustable coupling ratio. The adjustable coupling ratio may be achieved by adjusting the size of the oxide portion 26, the amount of the upper oxide portions 29 that is removed, the size of the first and second conductive layers 42A, 62, and the dielectric interlayer 52, without substantially altering the effective area of the tunnel oxide layer 30.

Then, a dielectric interlayer 52 is formed over the exposed surfaces of the first polysilicon layer 42A. The exposed surfaces of the first polysilicon layer 42A may include the channel top surfaces 41, side surfaces 43, upper top surfaces 45, and backside surfaces 47. The dielectric interlayer 52 may also be formed over the new oxide portion top surface 27.

As illustrated in FIG. 6, the dielectric interlayer 52 may comprise, e.g., an Oxide Nitride Oxide ("ONO") layer, and may be formed or grown by conventional techniques upon preferably all of the exposed surfaces of the first polysilicon layer 42A. The ONO layer preferably comprises successive layers of silicon dioxide, silicon nitride and silicon dioxide.

In one embodiment, the dielectric interlayer 52 may be removed from a periphery area (not shown). The periphery area may include, e.g., any area other than the cell array area, such as a charge pump area, a logic circuit area, and a decoder area.

Next, as illustrated in FIG. 2, a second polysilicon layer 62 is formed conventionally upon the exposed surfaces of the dielectric interlayer 52. Also, as shown in FIG. 2, a silicide layer 80 is formed upon the exposed surfaces of the second polysilicon layer 62, utilizing conventional techniques.

Any additional steps in the formation of the memory device 10, e.g., a second polysilicon layer gate patterning, are not shown for clarity.

In order to more fully understand the need and importance of improving the performance of the coupling ratio in IC devices, the following detailed discussion is provided.

As previously described, the gate coupling ratio ("α") may be defined as:

$$\alpha = C_{ono}/C_{ono} + C_{tox})$$

However, it is also understood that $$C_{ONO} = \frac{A_{ONO}}{T_{ONO}}(K_{ONO})$$

where:

$C_{ONO}$=ONO capacitance $A_{ONO}$=Surface area of ONO capacitor $T_{ONO}$=ONO thickness $K_{ONO}$=ONO dielectric constant As is understood from the above equations, when the increased overlap portion technique is utilized to form the larger surface area of the dielectric interlayer 52 (or ONO layer), the dielectric constant $K_{ONO}$ of the ONO layer, and the thickness $T_{ONO}$ remain approximately constant. However, because of the increased overlap, the effective surface area of the ONO capacitor is increased. Thus, the $C_{ONO}$, i.e., ONO capacitance, proportionally increases. This, in turn, proportionally increases the gate coupling ratio ("α").

It is also understood from the above equations, together with the detailed description herein, that the coupling ratio may be adjusted. Further, the coupling ratio may be adjusted independently of the tunnel oxide 30 area by adjusting either or both of the first and second polysilicon layer 42A, 62 areas. For example, the oxide portions 26 may be adjusted in height and width so as to vary the areas of the first and second polysilicon layers 42A, 62, and the dielectric interlayer 52 area.

Thus, the invention embodiments comprise a new device and technique to realize an improved coupling ratio integrated circuit device, by increasing an overlap portion between the first and second polysilicon layers, so as to increase the effective coupling ratio between the layers.

Further, unlike the prior art, the present invention allows for the ability to reduce the cell 10 size. Thus, the present invention provides a device and method for device density improvements.

The invention has been described in reference to particular embodiments as set forth above. However, only the preferred embodiment of the present invention, but a few examples of its versatility are shown and described in the present disclosure. It is to be understood that the present invention is capable of use in various other combinations and environments, and is capable of changes or modifications within the scope of the inventive concept as expressed herein. Also, many modifications and alternatives will become apparent to one of skill in the art without departing from the principles of the invention as defined by the appended claims.

What is claimed is:

1. A circuit device, comprising:

a. a substrate, b. a plurality of oxide portions formed upon the substrate at predetermined locations, wherein each oxide portion has exposed a side and top surface, c. a first conductive layer formed upon the substrate and upon at least a portion of two opposing exposed side surfaces of adjacent oxide portions, so that a channel portion is formed between said adjacent oxide portions, and an undercut portion is found above the top surface of each of said plurality of oxide portions, a continuous dielectric interlayer formed upon the first conductive layer, including the channel portion and the undercut portion, and e. a second conductive layer formed upon the dielectric interlayer, including the portion of the dielectric interlayer covering the channel portion and the undercut portion.

2. A circuit device as recited in claim 1, further comprising:

a plurality of shallow trench isolation regions that are formed in the substrate, wherein each of the shallow trench isolation regions are covered by a corresponding oxide portion.

3. A circuit device as recited in claim 1, wherein a top portion of the first conductive layer is removed prior to forming the dielectric interlayer.

4. A circuit device as recited in claim 1, wherein a top portion of the oxide portion is removed prior to forming the dielectric interlayer to form said undercut portion and expose said top exposed surface.

5. A circuit device as recited in claim 1, wherein the dielectric interlayer comprises successive layers of silicon dioxide, silicon nitride and silicon dioxide.

6. A circuit device as recited in claim 1, further comprising:
   a tunnel oxide layer formed sandwiched between at least a portion of the substrate and at least a portion of the first conductive layer.

7. A circuit device as recited in claim 6, wherein
   the adjacent oxide portions is utilized to form each of the first conductive layer, dielectric interlayer, and second conductive layer with a larger surface area as compared to the tunnel oxide layer, so as to improve a coupling ratio of the circuit device.

8. A circuit device as recited in claim 1, wherein
   the first and second conductive layers comprise polysilicon.

9. A circuit device as recited in claim 1, wherein
   the circuit device comprises at least one of
      i. a shallow trench isolation type device,
      ii. a semiconductor non-volatile memory device, and
      iii. a field effect transistor.

* * * * *